United States Patent [19]

Fletcher et al.

[11] 4,088,954
[45] May 9, 1978

[54] MAGNETOMETER WITH A MINIATURE TRANSDUCER AND AUTOMATIC SCANNING

[76] Inventors: James C. Fletcher, Administrator of the National Aeronautics and Space Administration, with respect to an invention of William J. Debnam, Jr., Hampton; Carl L. Fales, Jr.; Roger A. Breckenridge, both of Newport News, all of Va.; Arthur V. Pohm, Ames, Iowa

[21] Appl. No.: 668,771

[22] Filed: Mar. 19, 1976

Related U.S. Application Data

[63] Continuation of Ser. No. 547,072, Feb. 4, 1975, abandoned.

[51] Int. Cl.² .............................................. G01R 33/04
[52] U.S. Cl. ...................................................... 324/249
[58] Field of Search ................................ 324/43 R, 47

[56] References Cited

U.S. PATENT DOCUMENTS

| 3,319,161 | 5/1967 | Beynon | 324/47 |
| 3,657,641 | 4/1972 | Kardashian | 324/43 R |

FOREIGN PATENT DOCUMENTS

| 4,610,634 | 5/1968 | Japan | 324/43 R |
| 230,435 | 6/1969 | U.S.S.R. | 324/43 R |

OTHER PUBLICATIONS

Kan; G.; New Uses for Fluxgate Principle; Electronics Indus; Aug. 1960, pp. 107-110.
Oshima et al.; High Sensitivity Plated Wire etc.; IEEE Trans. on Mag.; Sep. 1971; pp. 436-437.
Stenger et al.; Magnetic Field Mapper; NASA Publication #SP-5907(03); p. 15; Dec. 16, 1974.
Fales et al.; A Magnetometer Instrumentation Technique etc.; Rev. of Scien. Inst.; vol. 45; #8; Aug. 1974; pp. 1009-1011.

*Primary Examiner*—Robert J. Corcoran
*Attorney, Agent, or Firm*—William H. King; John R. Manning; Howard J. Osborn

[57] ABSTRACT

The magnetometer transducer includes a group of plated magnetic wires arranged in parallel physically and connected in series electrically to serve as a drive circuit, and several turns of 0.025mm diameter wire wound around the group of plated magnetic wires to serve as a sense coil. Each of the magnetic wires has a diameter of 0.05mm with their centers being 0.25mm apart. Because of its shape and small size, it is capable of very good spatial resolution of magnetic fields as low as 0.02oe and it can make measurements of transverse magnetic fields as close as 0.08mm from a surface. The magnetometer utilizes two X-Y recorders in a unique transducer scanning technique. One of the recorders moves the transducer over the specimen being measured and the other recorder records the measurements.

2 Claims, 1 Drawing Figure

U.S. Patent
May 9, 1978
4,088,954
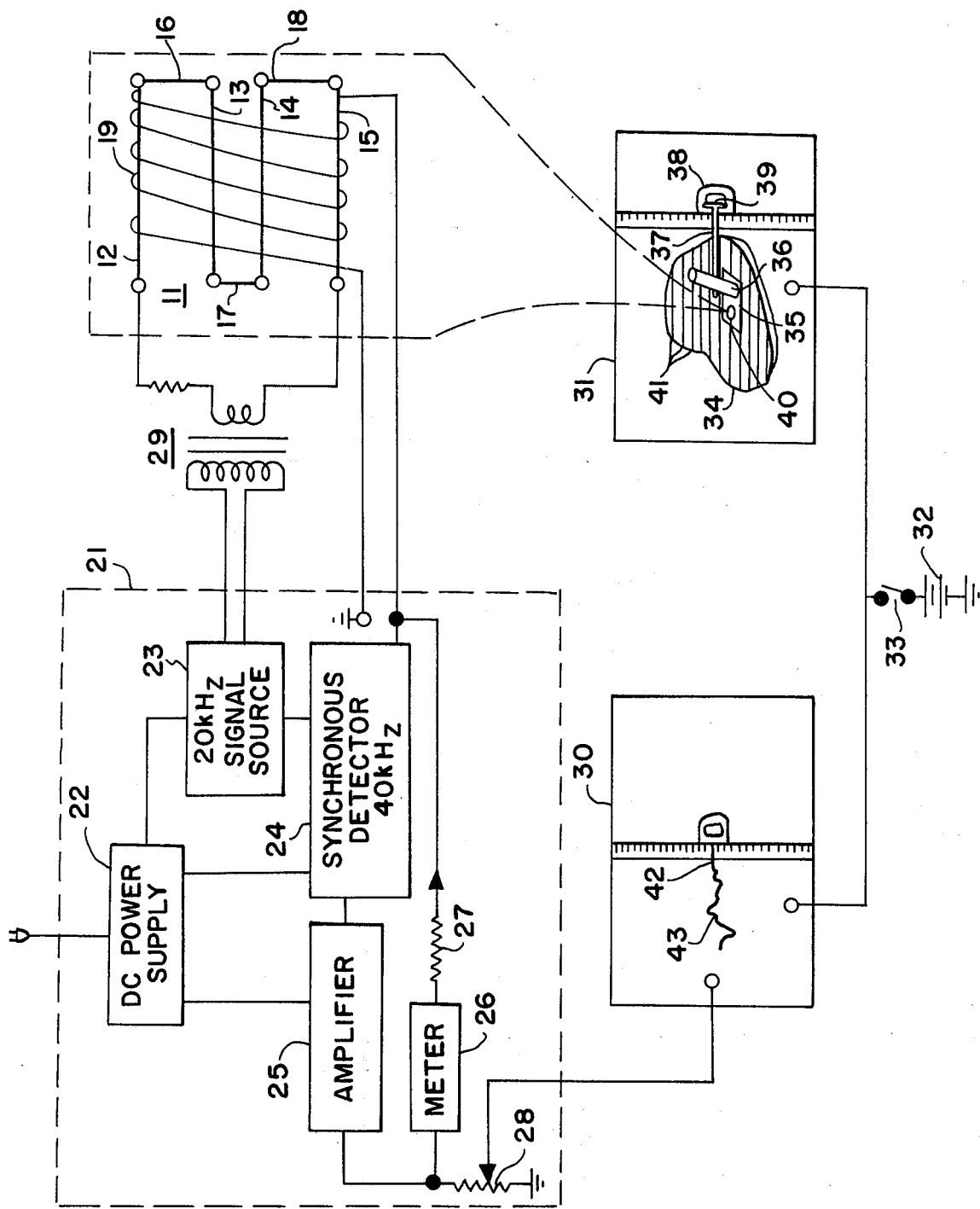

MAGNETOMETER WITH A MINIATURE TRANSDUCER AND AUTOMATIC SCANNING

This is a continuation division, of application Ser. No. 547,072 filed Feb. 4, 1975, now abandoned.

ORIGIN OF THE INVENTION

The invention described herein was made in the performance of work under a NASA contract and is subject to the provisions of section 305 of the National Aeronautics and Space Act of 1958, Public Law 85-568 (72 Stat. 435; 42 USC 2457).

BACKGROUND OF THE INVENTION

The invention relates generally to electric measuring instruments and more specifically concerns magnetometers.

Prior art magnetometers have been unable to measure magnetic fields with the spatial resolution necessary in some applications. Also, they have been unable to make measurements as close to a surface as is sometimes desirable.

It is therefore a primary object of this invention to provide a magnetometer capable of measuring magnetic fields with a very good spatial resolution.

Another object of this invention is to provide a magnetometer that is capable of measuring magnetic fields extremely close to a surface.

A further object of the invention is to use a clip-on milliameter in a magnetometer for driving and processing the electrical signals and readout.

Still another object of this invention is to use a specially designed transducer holding mechanism that replaces the ink pen of an X-Y recorder and the use of the X-Y recorder and another X-Y recorder to provide an automatic scanning readout for a magnetometer.

SUMMARY OF THE INVENTION

The magnetometer that constitutes this invention is based on the time variation of the magnetic permeability in the magnetic material of its transducer; however, its operation is substantially different from the ordinary flux-gate magnetometer. The transducer uses 0.05 mm diameter plated magnetic wire and is made flat enabling it to make measurements of transverse magnetic fields as close as 0.08 mm from a surface, and it has very good spatial resolution because of its small active region of approximately 0.64 mm by 0.76 mm. The magnetometer uses an inexpensive clip-on milliameter (commonly found in most laboratories) for driving and processing the electrical signals and readout. It also utilizes and automatic scanning technique which is made possible by a specially designed transducer holding mechanism that replaces the ink pen on an X-Y recorder.

BRIEF DESCRIPTION OF THE DRAWING

The sole FIGURE is a schematic drawing of a preferred embodiment of this invention.

DETAILED DESCRIPTION OF THE INVENTION

Turning now to the embodiment of the invention selected for illustration in the drawing, the number 11 designates the drive circuit for the transducer portion of the magnetometer. The drive circuit consists of four plated magnetic wires 12-15 arranged essentially in parallel and in the same plane physically and connected in series electrically by copper wires 16-18. Each of the plated magnetic wires consists of a thin layer of nickel-iron magnetic alloy plated on a copper-beryllium substrate. Even though four of the plated magnetic wires are used in the disclosed embodiment of the invention, it is to be understood that more or fewer of these wires can be used without departing from this invention. The drive circuit has 10-30 turns of cooper wire wound around it to serve as a sense coil 19. Drive circuit 11 and sense coil 19 constitute the transducer for the magnetometer.

The basic elements of the magnetic field transducer are the four plated magnetic wires 12-15. The wire consists of approximately 0.6 micrometer of a nickel-iron alloy plated on a 0.05 mm diameter beryllium-copper substrate. Initially, the plated wires are cut approximately 1.90 mm long for purposes of handling. Then, the wires are masked with either photoresist or thinned coil dope and are etched in ferric chloride leaving a 0.56 - 0.64 mm length of magnetic film on the wire. The wires are rinsed with distilled water and alcohol and allowed to dry. The masking material is removed, and the wires are again rinsed in alcohol and dried.

The four etched wires are now mounted in a removable form to insure that the wires are parallel and in the same plane on 0.25 mm centers. Ten to thirty turns of insulated copper wire which is 0.025 mm in diameter is wound around the plated portion of the etched wires to form a sense coil. The wire assembly is now coated with a clear epoxy, and the epoxy is cured at 60° for 2 hours. The wire assembly is carefully removed from the form, and electrical leads are attached between the etched portions of the four plated wires as close to the magnetic film as possible.

The connections are made such that the plated wires are in series and constitute the drive circuit. Two methods can be used to attach the electrical leads: one method is to thermocompression bond gold wire and the other is to solder copper wire. The excess portion of the etched wire is trimmed off as close to the electrical connections as possible.

The transducer is now completed and is ready for mounting. At this point, electrical continuity of the drive circuit and the sense coil are checked by measurement of their respective resistances. The transducer is mounted in a hole in a printed circuit board with transparent epoxy so that it can be as near as possible to the material on which the magnetic measurements are to be performed and still be protected from physical damage. Registration marks on the printed circuit board allow for proper alinement of the transducer with respect to the region to be tested. The transducer described here has certain dimensions due to the application for which it is intended; however, it is to be understood that other dimensions can be used without departing from the invention.

The transducer is calibrated by a strip conductor and a loop carrying known currents and also by direct comparison with a precision Hall probe Gaussmmeter. All three methods agree within 10 percent. Using the current strip as a source of external magnetic field, the milliammeter reading as a function of the external magnetic field is obtained. The calibration is linear from approximately 0.02 oe to 2.3 eo with a meter sensitivity of 2.6 ma/oe. A 20 percent error exists at 4.5 oe beyond which saturation effects dominate. For a fixed external magnetic field of 1.0 oe, the magnetometer sensitivity as a function of the peak drive current in the plated magnetic wires is experimentally obtained. The sensitivity increases rapidly for currents below 125 ma and finally levels out at roughly 3.5 ma/oe in the range of 300 ma. There is no perceptible meter deflection below a drive current of 28 ma.

A clip-on milliammeter 21 delivers the power to the transducer as well as processes the electrical signals from the transducer and provides a readout. The clip-on milliammeter, with plugs into regular 110 a.c. house current, consists essentially of a d.c. power supply 22, an a.c. signal source 23, a synchronous detector 24, a high gain amplifier 25, a meter 26, a feedback resistor 27 and a potentiometer 28. The clip-on milliammeter is of a type that if found in most laboratories, such as for example, a Hewlett-Packard Model 428B clip-on milliammeter. The signal source 23 delivers a 20 kHz signal through a transformer 29 to the drive circuit. This current is sufficient to drive the magnetic coating of the wires 12-15 into saturation in the circumferential direction twice each cycle. As a result, the magnetic permeability associated with the axial direction of the wires is reduced to a small value twice each cycle coincident with the alinement of the magnetic domains into the circumferential direction. For sufficiently small external axial magnetic field intensities, the axial magnetic flux density is the product of the external field and the magnetic permeability. Since the sense coil predominately links the axial magnetic flux, then by Faraday's law the open-circuit voltage developed across the sense coil has a dominant 40 kHz component and is proportional to the magnetic field perpendicular to the plane of the same coil and along the length of the magnetic wires.

The second harmonic, or 40 kHz, signal induced in sense coil 19 is detected by synchronous detector 24 and then amplified by high gain amplifier 25. A fraction of the output current is returned as a d.c. negative feedback current to sense coil 19 through meter 26 and feedback resistor 27. The feedback current to sense coil 19 generates a d.c. magnetic field that very nearly cancels the external field to be measured. The output signal of the synchronous detector becomes almost zero, and the feedback current monitored by meter 26 is proportional to the external magnetic field.

Two X-Y recorders 30 and 31 along with a transducer holding mechansim used in place of the recorder 31 ink pen form a scanning apparatus for the magnetometer. A part of the feedback signal from the output of amplifier 25 which is proportional to the external magnetic field, is applied by means of potentiometer 28, to the Y input of recorder 30. A voltage source 32 is applied through a control switch 33 to the X inputs of recorders 30 and 31 to synchronize the sweeps of the two recorders. The specimen 34 whose magnetic field is to be measured, is located on the recorder 31. The transducer holding mechanism consisting of a flat printed circuit board 35, an upright piece 36 attached to board 35, and a rod 37 is attached to upright piece 36 and the ink pen holder 38 of recorder 31 by means of a cross piece 39. The transducer is located in a hole 40 of flat board 35 such that it is in close proximity with the surface of speciment 34. The transducer and specimen 34 are placed inside a mumetal box (not shown) to shield them from the earth's magnetic field and magnetic fields originating from the X-Y recorder.

In the operation of the magnetometer the specimen 34 is marked with desired scan lines 41 in the X-direction. The transducer is then placed above one of the lines 41 and switch 33 is closed to apply the voltage 32 to recorder 31 to slowly move the transducer along the line. Since the voltage 32 is also applied to recorder 30, ink pen 42 of recorder is also moved in the X-direction. Inasmuch as the signal from potentiometer 28 is proportional to the magnetic field measured by the magnetometer and this signal is applied to the Y input of recorder 30, the line 43 made by ink pen 42 is a graph of the magnetic field along the line 41 scanned by recorder 31.

The magnetometer has been used with good results to determine the presence of magnetic remanence in the magnetic word strap keepers on memory planes of experimental and production lines plated-wire memories and to measure the transverse magnetic field component at the surface of geological rock specimens.

The advantages of this invention are that its active region is small thereby providing good spatial resolution; it is able to measure transverse magnetic fields as close as 0.08 mm to a surface; it uses a clip-on milliammeter for driving the transducer and for processing the electrical signals and readout; and it uses two X-Y recorders, with the aid of a specially-designed transducer holding mechanisms, for automatic scanning and readout.

It is to be understood that the form of the invention herewith shown and described is to be taken as a preferred embodiment. Various changes may be made in the shape, size and arrangement of parts. For example, equivalent elements may be substituted for those illustrated and described herein and certain features of the invention may be utilized independently of the use of other features, all without departing from the spirit or scope of the invention as defined in the subjoined claims. In addition, a combination of three of the transducers in mutually perpendicular orientation can be used to provide for measurement of the total vector magnetic field near the surface of a magnetic specimen.

What is claimed is:

1. A magnetometer comprising:

A miniature transducer including a group of at least two plated magnetic wires arranged in parallel and all in the same plane physically and connected in series electrically to serve as a drive circuit, several turns of wire wound around said group of plated magnetic wires to serve as a sense coil and a binding material coating the combined said drive circuit and said sense coil for forming a flat and extremely thin transducer;

means for supplying an a.c. current with sufficient amplitude and with a frequency $f$ to said series connected plated magnetic wires to drive the magnetic coating of the magnetic wires into saturation in the circumferential direction twice each cycle;

a first x-y recorder with means, substituted for the ink pen of the x-y recorder, for holding said miniature transducer such that the transducer will scan the specimen as the recorder is operated in the x direction and means for applying a voltage to said x-y recorder to cause it to operate in the x direction;

said miniature transducer mounted on said first x-y recorder such that the plane containing said plated magnetic wires is close to and parallel to the surface of said specimen as said miniature transducer is moved over the surface of said specimen; and means connected to said sense coil for measuring the signal induced in the sense coil due to the magnetic field being measured including a second x-y recorder with the voltage means applied to the x input of said first x-y recorder also applied to the x input of the second x-y recorder and means connected to the sense coil for applying a signal proportional to the signal induced in the sense coil to the y input of said second x-y recorder whereby when a voltage is applied to the x inputs of said first and second x-y recorders the miniature transducer is moved in the x direction over the first x-y recorder and the ink pen of the second x-y recorder is moved in the x direction over the second x-y recorder and records in the y direction the signals induced in the sense coil.

2. A magnetometer according to claim 1 wherein said means for holding said miniature transducer comprises an elongated rod attached to the recorder in place of the recorder ink pen, an upright piece attached to the end of said rod opposite where it is attached to said recorder, and means for attaching said miniature transducer to said upright piece such that as the X-Y recorder operates in the X direction said transducer will move over said specimen and in close proximity therewith.

* * * * *